(12) United States Patent
Qian et al.

(10) Patent No.: US 9,614,177 B2
(45) Date of Patent: Apr. 4, 2017

(54) OLED PACKAGE METHOD AND OLED PACKAGE STRUCTURE

(71) Applicant: Shenzhen China Star Optoelectronics Technology Co., Ltd., Shenzhen, Guangdong (CN)

(72) Inventors: Jiajia Qian, Guangdong (CN); Yawei Liu, Guangdong (CN); Chihche Liu, Guangdong (CN); Taipi Wu, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 147 days.

(21) Appl. No.: 14/426,986

(22) PCT Filed: Sep. 19, 2014

(86) PCT No.: PCT/CN2014/086883
§ 371 (c)(1),
(2) Date: Mar. 9, 2015

(87) PCT Pub. No.: WO2016/029523
PCT Pub. Date: Mar. 3, 2016

(65) Prior Publication Data
US 2016/0248042 A1    Aug. 25, 2016

(30) Foreign Application Priority Data
Aug. 29, 2014 (CN) .......................... 2014 1 0436753

(51) Int. Cl.
*H01L 51/52* (2006.01)
*H01L 51/56* (2006.01)
(Continued)

(52) U.S. Cl.
CPC ...... *H01L 51/5246* (2013.01); *H01L 27/3244* (2013.01); *H01L 51/001* (2013.01);
(Continued)

(58) Field of Classification Search
CPC ............. H01L 51/5246; H01L 27/3244; H01L 51/001; H01L 51/56; H01L 2251/303; H01L 51/5259; H01L 2227/323
See application file for complete search history.

(56) References Cited

U.S. PATENT DOCUMENTS

2012/0169229 A1   7/2012  You
2012/0318023 A1*  12/2012 Shimomura ............ C03C 27/06
                                                    65/43
2016/0035996 A1*  2/2016  Sun ........................ H01L 21/77
                                                    257/40

FOREIGN PATENT DOCUMENTS

CN          203415629 U       1/2014

OTHER PUBLICATIONS

Translation of Chinese Office action for Puublication 201410436753.7.*

* cited by examiner

*Primary Examiner* — Tracie Y Green
(74) *Attorney, Agent, or Firm* — Andrew C. Cheng (57) ABSTRACT

The present invention provides an OLED package method and an OLED package structure. The method comprises steps of: providing a substrate (1) to be packaged, and a package cover plate (2); forming an inorganic protective frame (11) in a round at the edges of the substrate (1); manufacturing an OLED element (12) on the substrate (1) inside the inorganic protective frame (11); pasting a solid glue film (21) on the package cover plate (2); forming an adhesive (22) in a round on the package cover plate (2) corresponding to a location of the inorganic protective frame (Continued)

(11); oppositely attaching the substrate (1) and the package cover plate (2), and the substrate (1) and the package cover plate (2) are affixed together by the solid glue film (21) and the adhesive (22) to accomplish the package to the substrate (1) with the package cover plate (2).

11 Claims, 8 Drawing Sheets

(51) Int. Cl.
  *H01L 27/32* (2006.01)
  *H01L 51/00* (2006.01)
(52) U.S. Cl.
  CPC .......... *H01L 51/56* (2013.01); *H01L 51/5259* (2013.01); *H01L 2227/323* (2013.01); *H01L 2251/303* (2013.01)

Fig. 13 ical equipment. In addition, the material of the dryer is inorganic material and the same with the inorganic frame. The air tightness between the inorganic frame and the dryer and the substrate is better, and the capability of resisting water vapor is better; the capability of resisting water vapor of the whole package structure is better than the present UV package which only possesses the DAM glue.

OLED PACKAGE METHOD AND OLED PACKAGE STRUCTURE

FIELD OF THE INVENTION

The present invention relates to a display technology field, and more particularly to an OLED package method and an OLED package structure.

BACKGROUND OF THE INVENTION

In the display technology field, flat panel display technologies, LCD (Liquid Crystal Display) and OLED (Organic Light Emitting Diode) have been gradually replaced the CRT (Cathode Ray Tube) displays. The flat light source technology is a new type light source and its skill development has been reached up for the mass production level of the market.

The package is the significantly important key procedure for the manufacture of an OLED element. The water and oxygen in the air has huge influence to the lifetime of the organic light emitting material in the OLED structure. Therefore, the extent of the package directly influences the sealing performance and leads to huge changes to the usage lifetime and quality of the productions. Accordingly, the package technology is the significantly important skill for determining the quality of the OLED elements.

The ultra-violet light curing technology is the most earliest and most common skill employed for the LCD/OLED packages. It possesses properties below: no solvent or little solvent is required, which diminishes the pollution of the solvent to the environment; the energy consumption is less and low temperature curing is possible which is suitable for heat sensitive material; the curing speed is fast and efficiency is high which can be applied to the high speed production line. The occupied space of the curing apparatus is small. Nevertheless, the UV glue is organic material. The molecular clearance after curing becomes larger. The water vapor and the oxygen can easily pass through the media and reach to the inside of the sealed space. Therefore, the technology should be suitable for the application field which is not sensitive to the water vapor and the oxygen, such as LCD. The OLED elements are highly sensitive to the water vapor and the oxygen. When the UV package is applied, dryer can be generally arranged inside the elements to eliminate the water vapor passing through the media and reach the inside of the sealed space for extending the usage lifetime of the OLED elements.

Figure 1:
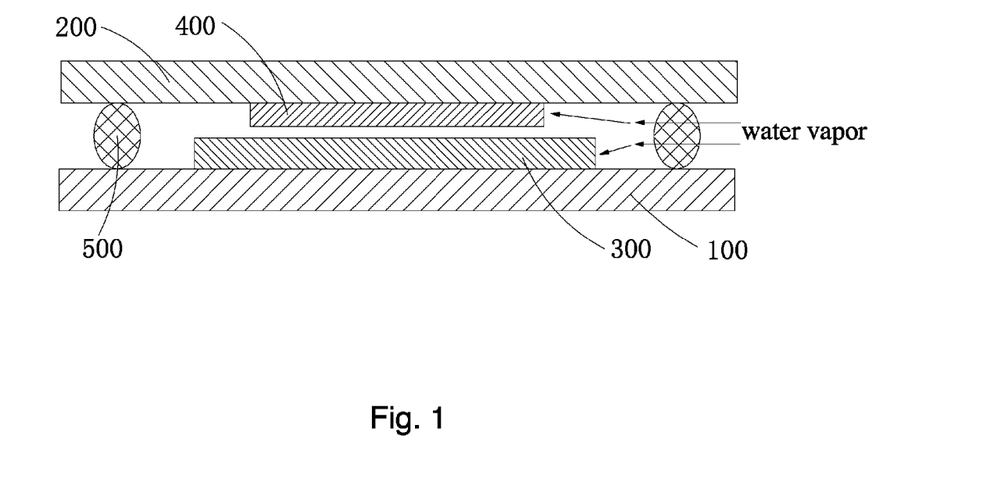
FIG. 1 is a sectional diagram of an OLED package structure according to prior art.
Figure 2:
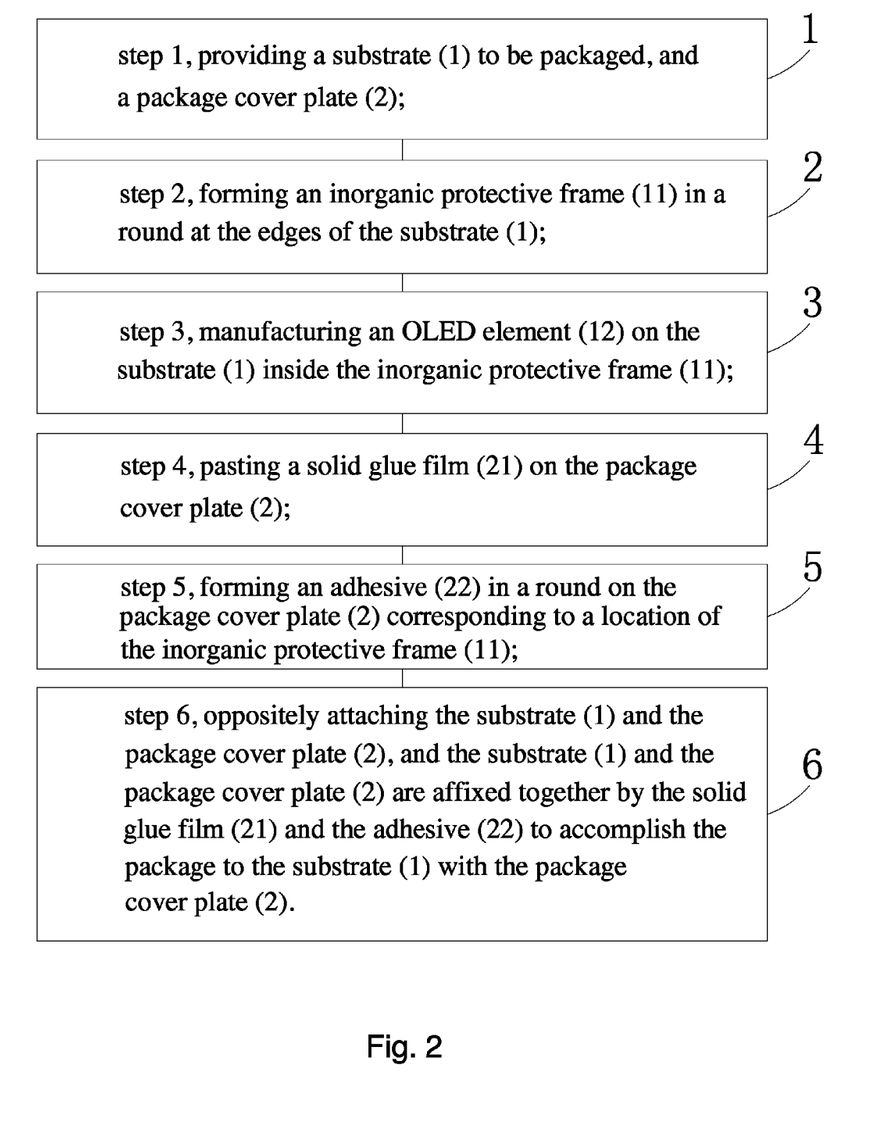
FIG. 2 is a flowchart of an OLED package method according to the present invention.

The present package of the OLED elements mainly utilizes the UV glue and the dryer for package as shown in FIG. 1. In such package method, the dryer 400 is attached at the inner side of the package cover plate 200. The UV glue 500, such as epoxy resin and et cetera is employed to oppositely attach the substrate 100 and the package cover plate 200. The capability of water resistance of such package method is poor and the lifetime of the elements cannot be long. Because the gaps exist, the water vapor gets easy to react with the OLED elements. The mechanical strength of the large scale panel descends with high possibility.

SUMMARY OF THE INVENTION

An objective of the present invention is to provide an OLED package method. By using the method, it is capable of improving the package result to raise the capability of resisting water vapor, and meanwhile to provide enough mechanical strength and to extend the usage lifetime of the OLED element.

Another objective of the present invention is to provide an OLED package structure, and the package result of the OLED package structure is well. The capability of resisting water vapor is strong. Meanwhile, the internal space in the package body is small. The mechanical strength is high and the usage lifetime of the OLED element can be extended.

For realizing the aforesaid objective, the present invention provides an OLED package method, comprising steps of:

step 1, providing a substrate to be packaged, and a package cover plate;

step 2, forming an inorganic protective frame in a round at the edges of the substrate;

step 3, manufacturing an OLED element on the substrate inside the inorganic protective frame;

step 4, pasting a solid glue film on the package cover plate;

step 5, forming an adhesive in a round on the package cover plate corresponding to a location of the inorganic protective frame;

step 6, oppositely attaching the substrate and the package cover plate, and the substrate and the package cover plate are affixed together by the solid glue film and the adhesive to accomplish the package to the substrate with the package cover plate.

The substrate is a TFT substrate, and the package cover plate is a glass plate or a metal plate, and the metal plate is formed with alloy.

In the second step, the inorganic protective frame is formed with SiNx; in the third step, the OLED element is manufactured by evaporation method.

The fourth step is: forming a dryer in a round on the package cover plate inside a location corresponding to the location of the inorganic protective frame, and the solid glue film is attached inside the dryer.

An attachment procedure of the solid glue film is performed in a nitrogen ambience, and a height of the solid glue film is slightly larger than a height of the inorganic protective frame.

An area of the solid glue film is equal to or larger than an area of a top surface or a bottom surface of the OLED element to be packaged for completely covering the OLED element with the solid glue film after the substrate and the package cover plate are attached.

The adhesive in the fifth step is DAM glue.

The dryer is calcium oxide.

The present invention further provides an OLED package structure, comprising a substrate, and a package cover plate tight attaching with the substrate, an OLED element located between the substrate and the package cover plate, a solid glue film completely covering the OLED element, an inorganic protective frame outside the solid glue film, and an adhesive located between the inorganic protective frame and the package cover plate.

The OLED package structure further comprises a dryer located between inorganic protective frame and the solid glue film.

The benefits of the present invention are: according to the OLED package method and the OLED package structure of the present invention, by locating inorganic frame between the substrate and the package cover plate, the capability of resisting water vapor is very well; with the condition of providing the dryer and the dryer is close to the inorganic frame, the water vapor can be immediately absorbed in the intruding path of the water vapor to prevent the influence of the water vapor to the utmost; meanwhile, the solid glue film located inside the package body also provides a certain water resistance capability; by using the aforesaid arrangement, the package result of the OLED structure can be obviously improved. The method is simple and practicable, and the operability is high; the package result of the OLED package structure is well. The capability of resisting water vapor is strong. Meanwhile, the internal space in the package body is small. The mechanical strength is high and the usage lifetime of the OLED element can be extended.

In order to better understand the characteristics and technical aspect of the invention, please refer to the following detailed description of the present invention is concerned with the diagrams, however, provide reference to the accompanying drawings and description only and is not intended to be limiting of the invention.

BRIEF DESCRIPTION OF THE DRAWINGS

The technical solution, as well as beneficial advantages, of the present invention will be apparent from the following detailed description of an embodiment of the present invention, with reference to the attached drawings.

In drawings.

DETAILED DESCRIPTION OF PREFERRED EMBODIMENTS

Embodiments of the present invention are described in detail with the technical matters, structural features, achieved objects, and effects with reference to the accompanying drawings as follows.

Please refer from FIG. 1, which shows the first embodiment of the OLED package method according to the present invention. The method comprises steps of:

step 1, providing a substrate 1 to be packaged, and a package cover plate 2.

The package cover plate 2 can be a glass plate or a metal plate. When it is a metal plate, it can be formed with alloy. Preferably, the package cover plate 2 is a glass plate.

Figure 3:
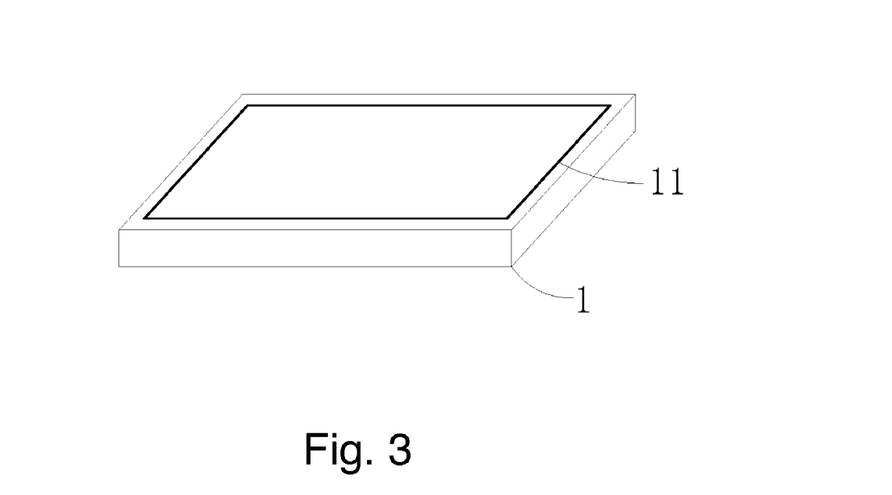
FIG. 3 is a diagram of the step 2 in the first embodiment of an OLED package method according to the present invention.

The substrate 1 is a TFT substrate.

step 2, forming an inorganic protective frame 11 in a round at the edges of the substrate 1.

Figure 4:
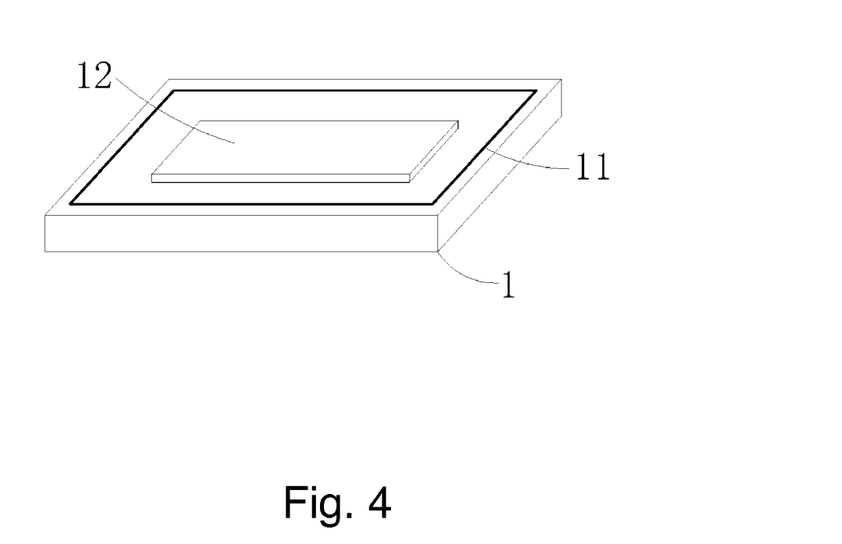
FIG. 4 is a diagram of the step 3 in the first embodiment of an OLED package method according to the present invention.

Preferably, the inorganic protective frame 11 is formed with SiNx. The arrangement of the inorganic protective frame 11 can block the intrusion of the water vapor better.

step 3, manufacturing an OLED element 12 on the substrate 1 inside the inorganic protective frame 11.

Figure 5:
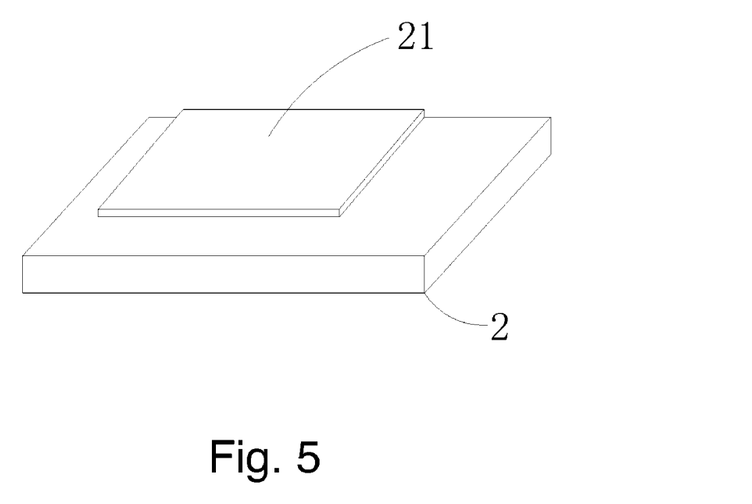
FIG. 5 is a diagram of the step 4 in the first embodiment of an OLED package method according to the present invention.

Specifically, the OLED element 12 is manufactured by evaporation method.

step 4, pasting a solid glue film 21 on the package cover plate 2.

An area of the solid glue film 21 is equal to or larger than an area of a top surface or a bottom surface of the OLED element to be packaged for completely covering the OLED element 12 with the solid glue film 21 after the substrate 1 and the package cover plate 2 are attached.

A height of the solid glue film 21 should be slightly larger than a height of the inorganic protective frame 11.

Figure 6:
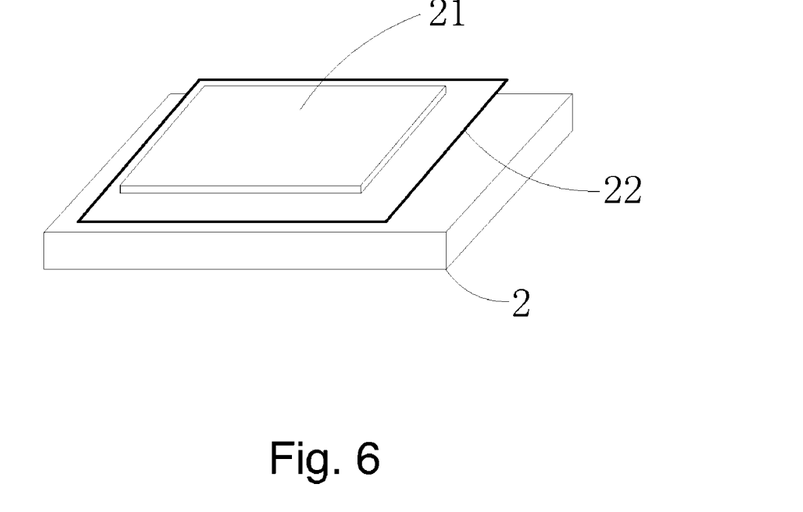
FIG. 6 is a diagram of the step 5 in the first embodiment of an OLED package method according to the present invention.

Specifically, an attachment procedure of the solid glue film 21 is performed in a nitrogen ambience. Because the solid glue film 21 also provides a certain water resistance capability and the internal space in the package body after arranging the solid glue film 21 is small. The mechanical strength is high.

step 5, forming an adhesive 22 in a round on the package cover plate 2 corresponding to a location of the inorganic protective frame 11.

Figure 7:
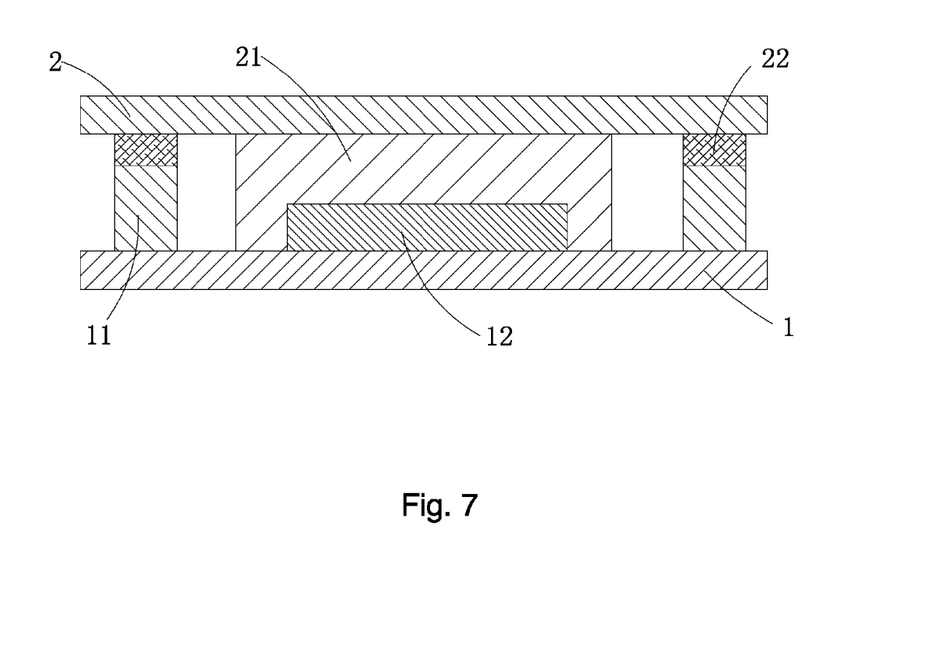
FIG. 7 is a sectional diagram of the first embodiment of an OLED package structure according to the present invention.

Preferably, the adhesive 22 is DAM glue. The adhesive 22 is located outside the solid glue film 21.

step 6, oppositely attaching the substrate 1 and the package cover plate 2, and the substrate 1 and the package cover plate 2 are affixed together by the solid glue film 21 and the adhesive 22 to accomplish the package to the substrate 1 with the package cover plate 2.

As shown in FIG. 7, on the basis of the aforesaid package method, the present invention further provides an OLED package structure, comprising a substrate 1, and a package cover plate 2 tight attaching with the substrate 1, an OLED element 12 located between the substrate 1 and the package cover plate 2, a solid glue film 21 completely covering the OLED element 12, an inorganic protective frame 11 outside the solid glue film 21, and an adhesive 22 located between the inorganic protective frame 11 and the package cover plate 2.

The substrate 1 is a TFT substrate. The package cover plate 2 can be a glass plate or a metal plate. When it is a metal plate, it can be formed with alloy. Preferably, the package cover plate 2 is a glass plate.

The inorganic protective frame 11 is formed with SiNx. The adhesive 22 is DAM glue.

Please refer from FIG. 8 to FIG. 13, which shows the second embodiment of the OLED package method according to the present invention. The method comprises steps of:

step 1, providing a substrate 1 to be packaged, and a package cover plate 2.

The package cover plate 2 can be a glass plate or a metal plate. When it is a metal plate, it can be formed with alloy. Preferably, the package cover plate 2 is a glass plate.

Figure 8:
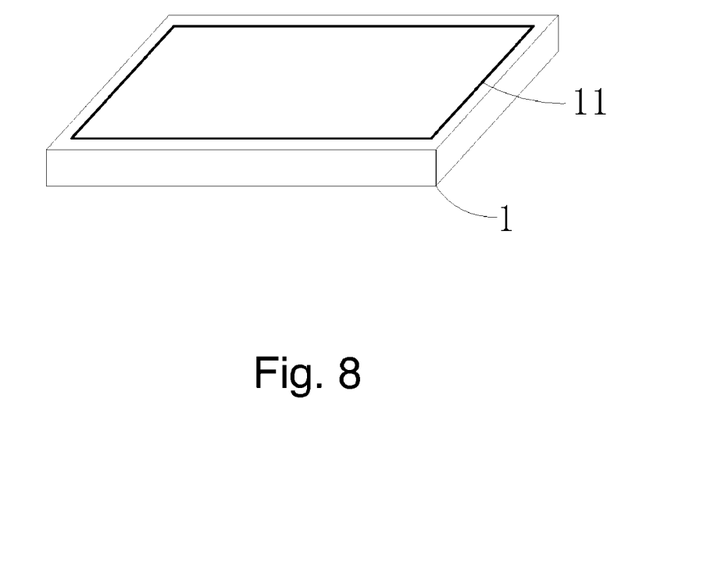
FIG. 8 is a diagram of the step 2 in the second embodiment of an OLED package method according to the present invention.

The substrate 1 is a TFT substrate.

step 2, forming an inorganic protective frame 11 in a round at the edges of the substrate 1.

Figure 9:
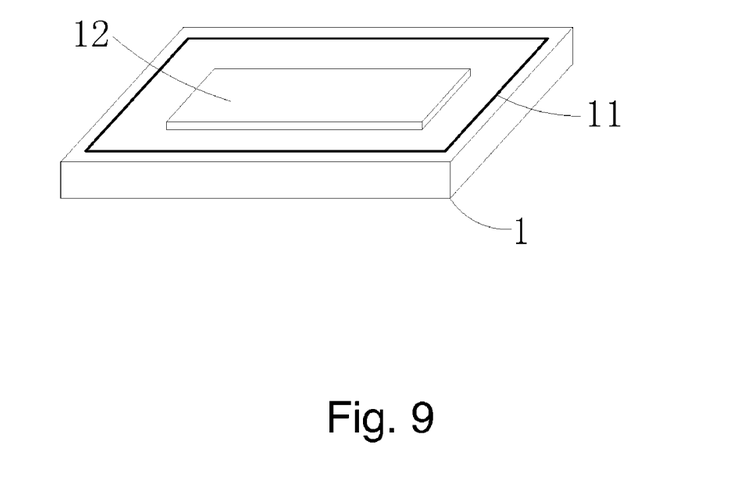
FIG. 9 is a diagram of the step 3 in the second embodiment of an OLED package method according to the present invention.

Preferably, the inorganic protective frame 11 is formed with SiNx. The arrangement of the inorganic protective frame 11 can block the intrusion of the water vapor better.

step 3, manufacturing an OLED element 12 on the substrate 1 inside the inorganic protective frame 11.

Figure 10:
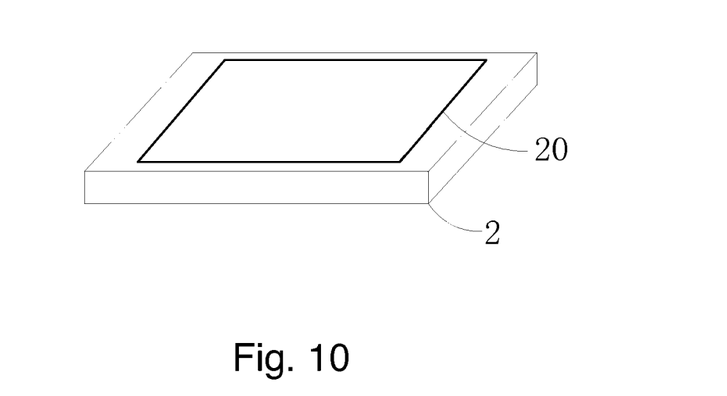
FIG. 10 is a diagram of the step 4 in the second embodiment of an OLED package method according to the present invention.

Specifically, the OLED element 12 is manufactured by evaporation method.

step 4, forming a dryer 20 in a round on the package cover plate 2 inside a location corresponding to the location of the inorganic protective frame 11.

Preferably, the dryer 20 is calcium oxide.

Figure 11:
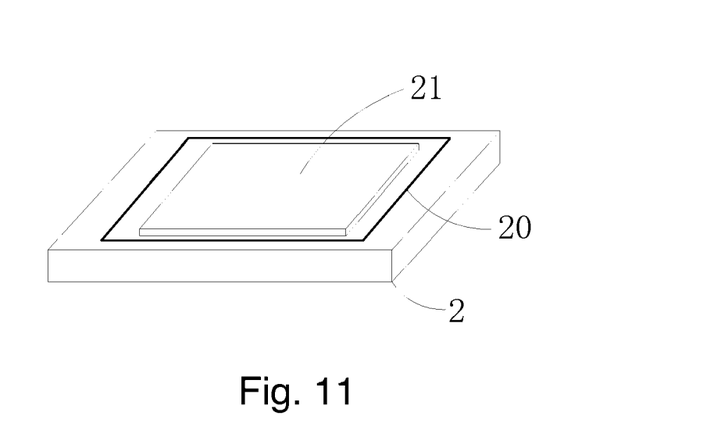
FIG. 11 is a diagram of the step 5 in the second embodiment of an OLED package method according to the present invention.

The merit of locating the dryer 20 is that after the package is accomplished, with the condition of providing the dryer 20 close to the inorganic protective frame 11, the dryer 20 can immediately absorb the water vapor in the intruding path of the water vapor to prevent the influence of the water vapor to the utmost.

step 5, attaching the solid glue film 21 inside the dryer 20 on the package cover plate 2.

An area of the solid glue film 21 is equal to or larger than an area of a top surface or a bottom surface of the OLED element to be packaged for completely covering the OLED element 12 with the solid glue film 21 after the substrate 1 and the package cover plate 2 are attached.

A height of the solid glue film 21 should be slightly larger than a height of the inorganic protective frame 11.

Figure 12:
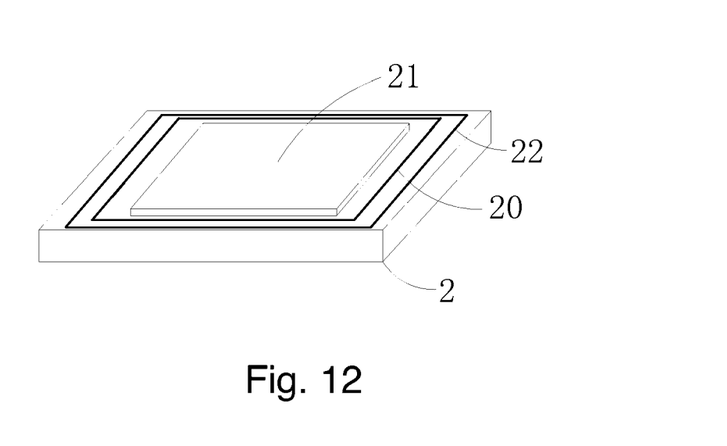
FIG. 12 is a diagram of the step 6 in the second embodiment of an OLED package method according to the present invention.

Specifically, an attachment procedure of the solid glue film 21 is performed in a nitrogen ambience. Because the solid glue film 21 also provides a certain water resistance capability and the internal space in the package body after arranging the solid glue film 21 is small. The mechanical strength is high.

step 6, forming an adhesive 22 in a round on the package cover plate 2 corresponding to a location of the inorganic protective frame 11.

Figure 13:
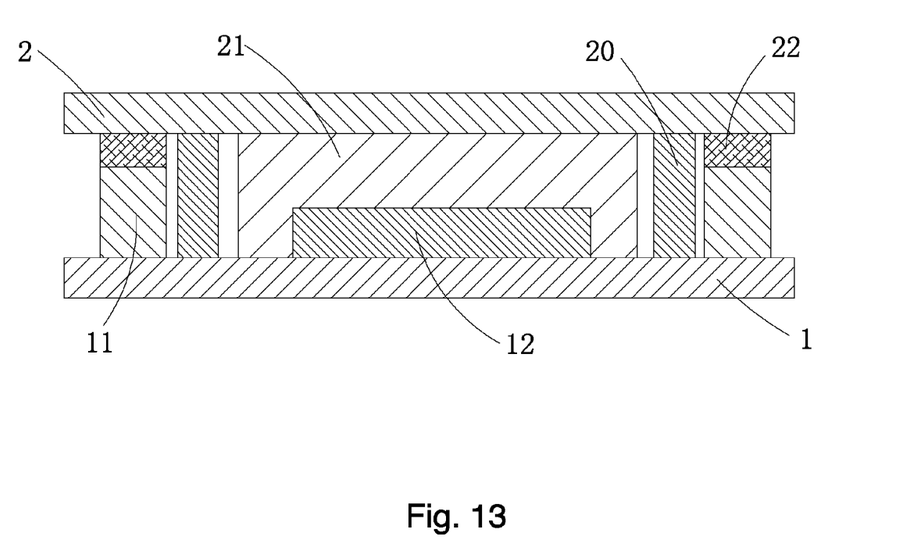
FIG. 13 is a sectional diagram of the second embodiment of an OLED package structure according to the present invention.

Preferably, the adhesive 22 is DAM glue. The adhesive 22 is located outside the solid glue film 21.

step 7, oppositely attaching the substrate 1 and the package cover plate 2, and the substrate 1 and the package cover plate 2 are affixed together by the solid glue film 21 and the adhesive 22.

Please refer to FIG. 13, on the basis of the aforesaid package method, the present invention further provides an OLED package structure, comprising a substrate 1, and a package cover plate 2 tight attaching with the substrate 1, an OLED element 12 located between the substrate 1 and the package cover plate 2, a solid glue film 21 completely covering the OLED element 12, an inorganic protective frame 11 outside the solid glue film 21, a dryer 20 located between the inorganic protective frame 11 and the solid glue film 21, and an adhesive 22 located between the inorganic protective frame 11 and the package cover plate 2. The substrate 1 is a TFT substrate. The package cover plate 2 can be a glass plate or a metal plate. When it is a metal plate, it can be formed with alloy. Preferably, the package cover plate 2 is a glass plate.

The inorganic protective frame 11 is formed with SiNx. The dryer 20 is calcium oxide. The adhesive 22 is DAM glue.

In conclusion, according to the OLED package method and the OLED package structure of the present invention, by locating inorganic frame between the substrate and the package cover plate, the capability of resisting water vapor is very well; with the condition of providing the dryer and the dryer is close to the inorganic frame, the water vapor can be immediately absorbed in the intruding path of the water vapor to prevent the influence of the water vapor to the utmost; meanwhile, the solid glue film located inside the package body also provides a certain water resistance capability; by using the aforesaid arrangement, the package result of the OLED structure can be obviously improved. The method is simple and practicable, and the operability is high; the package result of the OLED package structure is well. The capability of resisting water vapor is strong. Meanwhile, the internal space in the package body is small. The mechanical strength is high and the usage lifetime of the OLED element can be extended.

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

What is claimed is:

1. An OLED package method, comprising steps of:
   step 1, providing a substrate to be packaged, and a package cover plate;
   step 2, forming an inorganic protective frame in a round at the edges of the substrate, the inorganic protective frame being formed of SiNx;
   step 3, manufacturing an OLED element on the substrate inside the inorganic protective frame;
   step 4, pasting a solid glue film on the package cover plate;
   step 5, forming an adhesive in a round on the package cover plate corresponding to a location of the inorganic protective frame;
   step 6, oppositely attaching the substrate and the package cover plate, and the substrate and the package cover plate are affixed together by the solid glue film and the adhesive to accomplish the package to the substrate with the package cover plate, wherein the inorganic protective frame is in direct contact with and extends along the edges of the substrate and circumferentially encloses the OLED element and the solid glue film such that the OLED element is protected by the inorganic protective frame that comprises SiNx for preventing invasion of moisture and the solid glue film that blocks penetration of moisture therethrough.

2. The OLED package method according to claim 1, wherein the substrate is a TFT substrate, and the package cover plate is a glass plate or a metal plate, and the metal plate is formed with alloy.

3. The OLED package method according to claim 1, wherein the OLED element is manufactured by evaporation method.

4. The OLED package method according to claim 1, wherein the fourth step is: forming a dryer in a round on the package cover plate inside a location corresponding to the location of the inorganic protective frame, and the solid glue film is attached inside the dryer.

5. The OLED package method according to claim 1, wherein an attachment procedure of the solid glue film is performed in a nitrogen ambience, and a height of the solid glue film is larger than a height of the inorganic protective frame in the first step.

6. The OLED package method according to claim 1, wherein an area of the solid glue film is equal to or larger than an area of a top surface or a bottom surface of the OLED element to be packaged for completely covering the OLED element with the solid glue film after the substrate and the package cover plate are attached.

7. The OLED package method according to claim 1, wherein the adhesive in the fifth step is DAM glue.

8. The package method of the OLED panel according to claim 4, wherein the dryer is calcium oxide.

9. An OLED package structure, comprising a substrate, and a package cover plate tight attaching with the substrate, an OLED element located between the substrate and the package cover plate, a solid glue film completely covering the OLED element, an inorganic protective frame outside the solid glue film, and an adhesive located between the inorganic protective frame and the package cover plate, wherein the inorganic protective frame is in direct contact with and extends along edges of the substrate and circumferentially encloses the OLED element and the solid glue film such that the OLED element is protected by the inorganic protective frame that comprises SiNx for preventing invasion of moisture and the solid glue film that blocks penetration of moisture therethrough.

10. The OLED package structure according to claim 9, further comprising a dryer located between inorganic protective frame and the solid glue film.

11. An OLED package structure, comprising a substrate, and a package cover plate tight attaching with the substrate, an OLED element located between the substrate and the package cover plate, a solid glue film completely covering the OLED element, an inorganic protective frame outside the solid glue film, and an adhesive located between the inorganic protective frame and the package cover plate;
wherein the OLED package structure further comprises a dryer located between inorganic protective frame and the solid glue film; and
wherein the inorganic protective frame is in direct contact with and extends along edges of the substrate and circumferentially encloses the OLED element and the solid glue film such that the OLED element is protected by the inorganic protective frame that comprises SiNx for preventing invasion of moisture and the solid glue film that blocks penetration of moisture therethrough.

* * * * *